(12) United States Patent
Spriet et al.

(10) Patent No.: US 10,218,378 B1
(45) Date of Patent: Feb. 26, 2019

(54) ANALOG CONVERTER FOR MOTOR ANGLE SENSOR

(71) Applicant: Robert Bosch GmbH, Stuttgart (DE)

(72) Inventors: Kurt William Spriet, Farmington Hills, MI (US); Patrick Buchenberg, Sonthofen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/104,648

(22) Filed: Aug. 17, 2018

(51) Int. Cl.
*H03M 1/64* (2006.01)
*G01D 5/243* (2006.01)
*G01D 5/245* (2006.01)
*G01D 5/249* (2006.01)

(52) U.S. Cl.
CPC ............ *H03M 1/645* (2013.01); *G01D 5/243* (2013.01); *G01D 5/2454* (2013.01); *G01D 5/2497* (2013.01)

(58) Field of Classification Search
CPC ..... H03M 1/645; G01D 5/243; G01D 5/2454; G01D 5/249
USPC .................. 341/111, 112, 116, 117
See application file for complete search history.

(56) References Cited

U.S. PATENT DOCUMENTS

| 3,453,548 | A | | 7/1969 | Paradise |
| 3,763,489 | A | | 10/1973 | Greutman |
| 4,270,061 | A | | 5/1981 | Gronner |
| 4,489,266 | A | | 12/1984 | Franzolini |
| 4,703,307 | A | | 10/1987 | James et al. |
| 4,906,909 | A | | 3/1990 | Gremillion et al. |
| 5,557,273 | A | * | 9/1996 | Catanach .............. H03M 1/645 341/112 |
| 7,064,692 | B1 | | 6/2006 | Koshi et al. |
| 8,004,276 | B2 | * | 8/2011 | Nishimura .......... H03M 1/0836 324/207.25 |
| 2013/0173198 | A1 | | 7/2013 | Kurz et al. |

* cited by examiner

*Primary Examiner* — Khai M Nguyen
(74) *Attorney, Agent, or Firm* — Michael Best & Friedrich LLP

(57) ABSTRACT

An analog converter for a motor angle sensor is described. The analog converter for a motor angle sensor includes Gilbert Cells configured to receive a signal from a motor angle sensor, an intermediate frequency signal source configured to provide an excitation signal to the Gilbert Cells, a low-pass filter configured to receive an output from the Gilbert Cells, a Scott transformer to convert a three-phase waveform into a two-phase waveform, and output a converted signal to an electronic controller.

16 Claims, 6 Drawing Sheets

ANALOG CONVERTER FOR MOTOR ANGLE SENSOR

BACKGROUND

In permanent magnet brushless electric motors, alternating-current ("AC") inductive motors, and switched reluctance motors, position sensing of a rotor of the motor is necessary to properly commutate the current to coils of a stator. Resolvers, an analog device used for measuring degrees of rotation, are current state-of-the-art position sensors, especially in the automotive sector. The output signals of a resolver are two analog amplitude modulation carrier waveforms that have modulated phase separations of 90 degrees with an approximately 10 kilohertz carrier frequency. These output signals are sent to an electronic controller, where the signals undergo analog to digital conversion. The digital voltage values of the output signals are then input into an algorithm which determines an angle of the electric motor rotor. The angle is used by a motor control loop to determine an absolute position and a rotational speed of the rotor.

SUMMARY

There have been developments in motor angle sensors to improve upon the accuracy and cost of resolvers. However, the new motor angle sensors embodying these developments are not always compatible with current electronic controllers. This is due, at least in part, to the sensor output having a high frequency and/or a three-phase synchro composition.

In order to convert the sensor outputs from new resolvers to a format compatible with current electronic controllers in an inexpensive manner, an analog converter for a motor angle sensor is needed. If the motor angle sensor outputs a three-phase signal, a conversion to a two-phase signal and a frequency downshift is needed. If the motor angle sensor outputs a two-phase resolver signal, a frequency down conversion is still required.

Therefore, embodiments described herein provide, among other things, an analog converter for a motor angle sensor.

One embodiment provides an apparatus for an analog synchro to resolver converter.

DETAILED DESCRIPTION

Before any embodiments are explained in detail, it is to be understood that this disclosure is not intended to be limited in its application to the details of construction and the arrangement of components set forth in the following description or illustrated in the following drawings. Embodiments are capable of other configurations and of being practiced or of being carried out in various ways.

Figure 1:
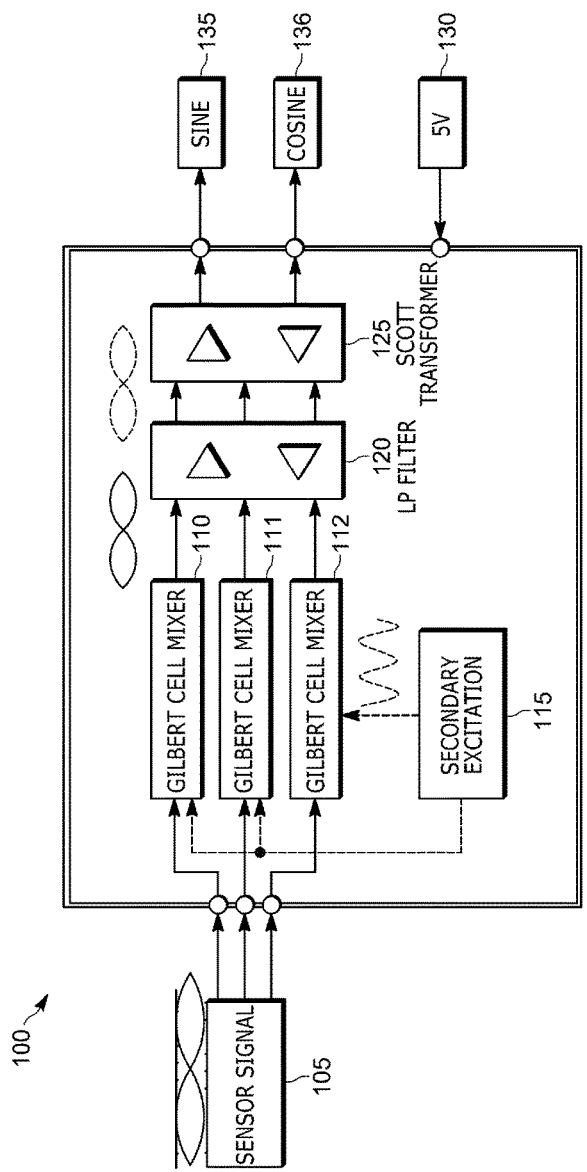
FIG. 1 illustrates a block diagram of an analog synchro to resolver converter according to one embodiment.

FIG. 1 illustrates a schematic of an analog synchro to resolver converter 100 (referred to hereinafter as the converter 100) according to one embodiment. The converter 100 receives a signal from a sensor 105 and includes at least two Gilbert Cells 110-112, an intermediate frequency signal source 115, a low-pass filter 120, a Scott transformer 125, and a power source 130.

The sensor 105 detects an absolute position and rotational speed of a rotor of an electric motor. The sensor 105 preserves the motor position data (the absolute position and rotational speed of the rotor) in a voltage amplitude modulated, high frequency sine wave. For example, the sensor 105 may be a synchro or a transformer that uses an excitation winding and any number of secondary receiver windings whose output changes as either a ferrous target wheel (variable reluctance method) or electrically conductive target (eddy current method) is passed through the magnetic fields developed by the excitation windings. Synchros are often used for measuring the angle of a rotating machine.

The sensor 105 may have three output channels (as shown in FIG. 1), each channel 60 degrees out of phase with the other channels or may have two output channels, each channel 90 degrees out of phase of the other channel. Each channel in either of the two types of sensors 105 will carry one phase of the output signal of the sensor 105. The sensor 105 outputs either a three-phase signal or a two-phase signal to the converter 100. The output signal from the sensor 105 is a carrier waveform that is sent to the at least two Gilbert Cells 110-112.

The embodiment shown in FIG. 1 includes three Gilbert Cells 110-112. If the sensor 105 includes three output channels, the converter 100 will include three Gilbert Cells 110-112. If the sensor 105 has only two output channels, the converter 100 will include only two of the Gilbert Cells 110-112 but will not include the Scott transformer 125.

Figure 2:
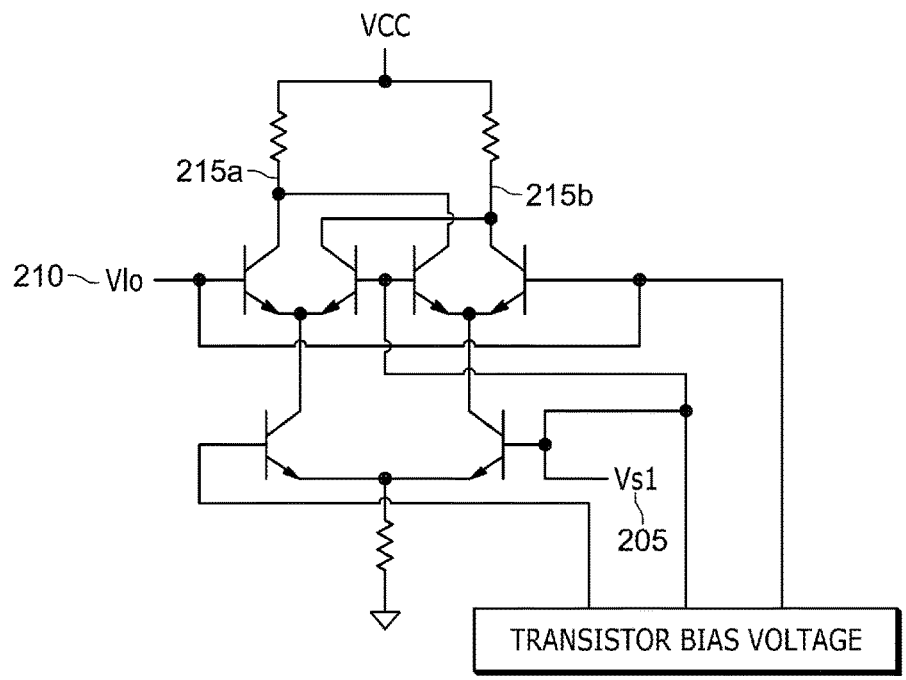
FIG. 2 illustrates a circuit schematic of a Gilbert Cell according to one embodiment.

The Gilbert Cells 110-112 are a type of mixer that produces an output signal proportional to the product of two input signals and are widely used for frequency conversion. Transistors that make up the Gilbert Cells 110-112 are properly biased by the power supply 130 and a suitable resistor network. A circuit schematic of the Gilbert Cells 110-112 is shown in FIG. 2.

The Gilbert Cells 110-112 each receive an input from the sensor 105 at signal source 205. The intermediate frequency signal is received at the transistor rail 210. After mixing the input from the sensor 105 and the intermediate frequency signal (as described below), the Gilbert Cells 110-112 output the signal to the low-pass filter 120 at output points 215a-b. The components of the Gilbert Cells 110-112 are biased by the power supply 130 (VCC in FIG. 2).

The Gilbert Cells 110-112 each receive the output signal from the sensor 105 and mix it with an intermediate frequency signal from the intermediate frequency source 115. The intermediate frequency signal must have a frequency equal to the difference between the carrier waveform from the sensor 105 and the desired down converted frequency.

The Gilbert Cells 110-112 perform a frequency down conversion using the input signals to each of the Gilbert Cells 110-112 and the intermediate frequency signal provided to each of the Gilbert Cells 110-112. The down conversion reduces the frequency of the received carrier waveform (from the sensor 105).

The Gilbert Cells 110-112 output a signal that is a product of the input from the sensor 105 and secondary excitation signal from the secondary excitation signal source 115 (the down conversion signal with a reduced frequency). The output signal from the Gilbert Cells 110-112 contains two main frequency components, the main frequencies being the sum of signals 205 and 210 and difference between signals 205 and 210. Each of the Gilbert Cells 110-112 outputs its own signal to the low-pass filter 120.

The output of the Gilbert Cells 110-112 is sent to the low-pass filter 120. Because the output of the Gilbert Cells 110-112 includes a signal with a frequency higher than the original frequency of the carrier waveform sent from the sensor 105 and a signal with a frequency lower than the original frequency of the carrier waveform sent from the sensor 105, the low-pass filter 120 is needed to filter out the high frequency and leave only the lower frequency signals. The highest frequency signal contains no useful information about rotor position and thus is filtered as to not transmit noise into the remaining circuit components.

Figure 3:
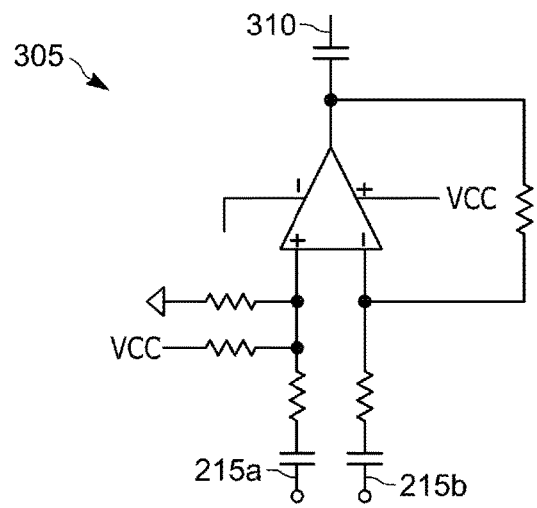
FIG. 3 illustrates a circuit schematic of a low-pass filter according to one embodiment.

FIG. 3 illustrates a circuit schematic of the low-pass filter 120. In some embodiments, the low-pass filter 120 has two or three separate low-pass filters (depending on the number of Gilbert Cells 110-112) in order to handle the different phases of signals received from the Gilbert Cells 110-112. Therefore, the circuit schematic illustrated in FIG. 3 illustrates a portion 305 of the low-pass filter 120. The low-pass filter 120 includes a number of the portion 305 that is equivalent to the number of Gilbert Cells 110-112 (two or three, based upon the number of phases output by the sensor 105). The portion 305 filters the signal it receives from the output points 215a-b from one of the Gilbert Cells 110-112 (as described below) and outputs a converted and filtered output at filtered output point 310. The low-pass filter 120 is powered by the power supply 130 (VCC in FIG. 3).

Figure 4:
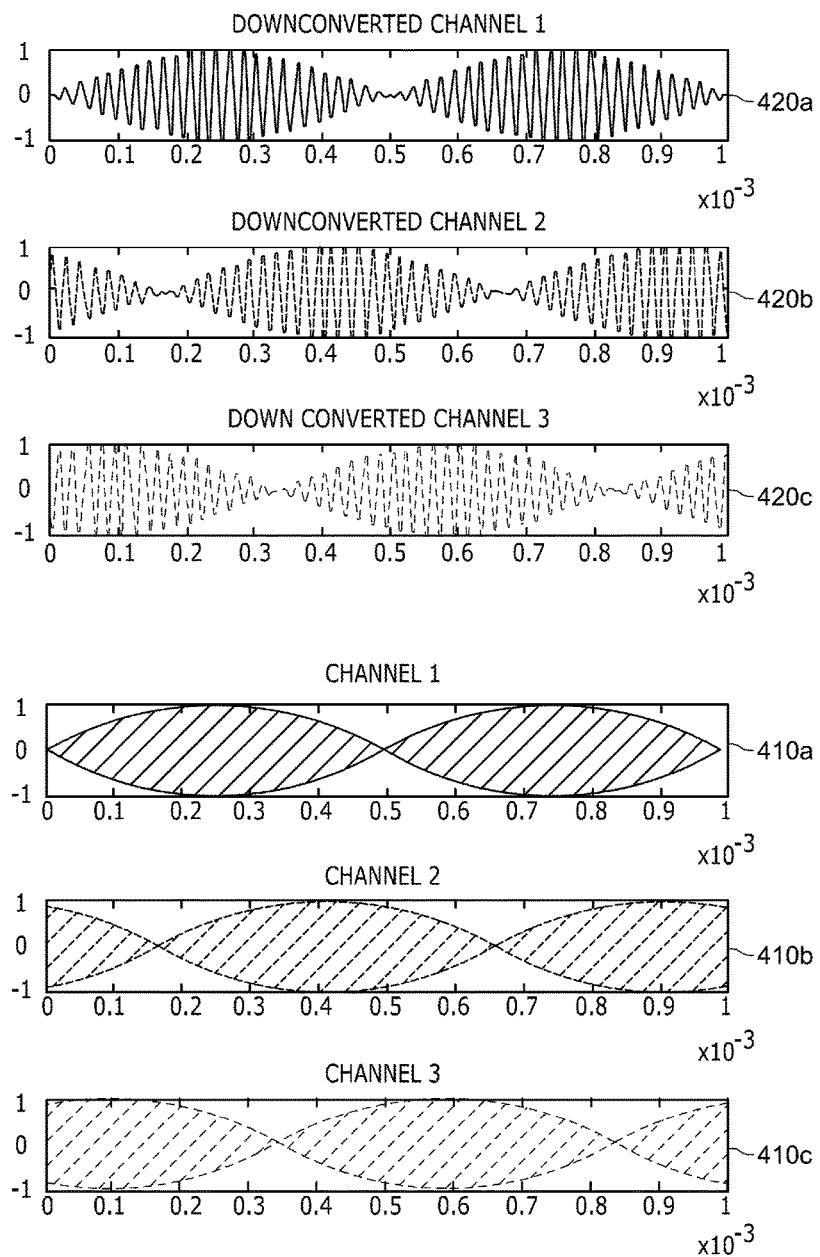
FIG. 4 illustrates down conversion and filtering performed on a signal in a Gilbert Cell and a low-pass filter according to one embodiment.

FIG. 4 illustrates the down conversion and filtering of the signal from the sensor 105 that is performed in the Gilbert Cells 110-112 and the low-pass filter 120 according to one embodiment. A sensor 105 output, 410a-c (shown in three phases coming from three channels), is sent to the Gilbert Cells 110-112 (each channel going to a separate Gilbert Cell) and is mixed with an intermediate frequency signal to produce a Gilbert output signal (with two main frequencies, one higher than the carrier waveform 410a-c and one lower than the carrier waveform 210a-c). The Gilbert output signal is then sent through the low-pass filter 120 to eliminate the higher frequency signal and keep the lower frequency signal. The result is a converted signal 420a-c.

Returning to FIG. 1, the converted signal 420a-c is sent from the low-pass filter 120 to an electronic controller when there are three ports available in the electronic controller. Within the electronic controller, the converted signal 420a-c has a sine component 135 and a cosine component 136. The sine component 135 and the cosine component 136 have voltage amplitude modulations 90 degrees out of phase with each other.

Figure 5:
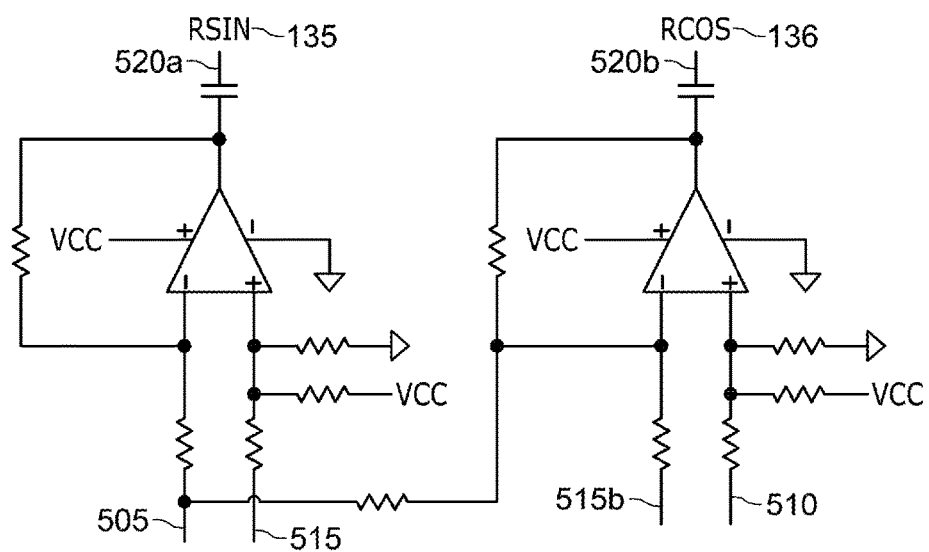
FIG. 5 illustrates circuit schematic of a Scott transformer according to one embodiment.

In some embodiments, the Gilbert output signal may first be sent to the Scott transformer 125 instead of directly to an electronic controller (for example, when there are only two input ports available at the electronic controller). For example, when the sensor 105 is a three-phase sensor, the converted signal 220a-c is sent to the Scott transformer 125. The mathematical operation to decode voltage data uses two variables, the sine and cosine, therefore, electronic controllers are designed for two phase sensors. Because the electronic controller with two input ports can only utilize a signal with two phases (and thus cannot use the three phases of the Gilbert output signal), the Scott transformer 125 is needed to transform the converted signal 220a-c into a two-phase signal with the sine component 135 and cosine component 136. The Scott transformer 125 is also powered by the power supply 130. A circuit schematic of the Scott transformer 125 is shown in FIG. 5.

As stated above, the Scott transformer 125 is used when a three-phase signal (originating from the sensor 105 and then down converted and filtered) is converted to a two-phase signal. The Scott transformer 125 therefore receives a first phase 505, a second phase 510, and a third phase 515a-b from the converted output of the low-pass filter 120 and transforms the three-phase converted output into a two-phase output 520a-b, which are the sine component 135 and the cosine component 136.

In some embodiments, the Scott transformer 125 is not used, and the three-phase signal from the sensor 105 may be converted into a two-phase signal digitally. This may require different hardware (for example, an analog to digital converter). However, if a three-phase signal is converted to two-phase signal digitally, the two-phase signal may require a conversion back to an analog signal in order to be usable by an electronic controller.

Figure 6:
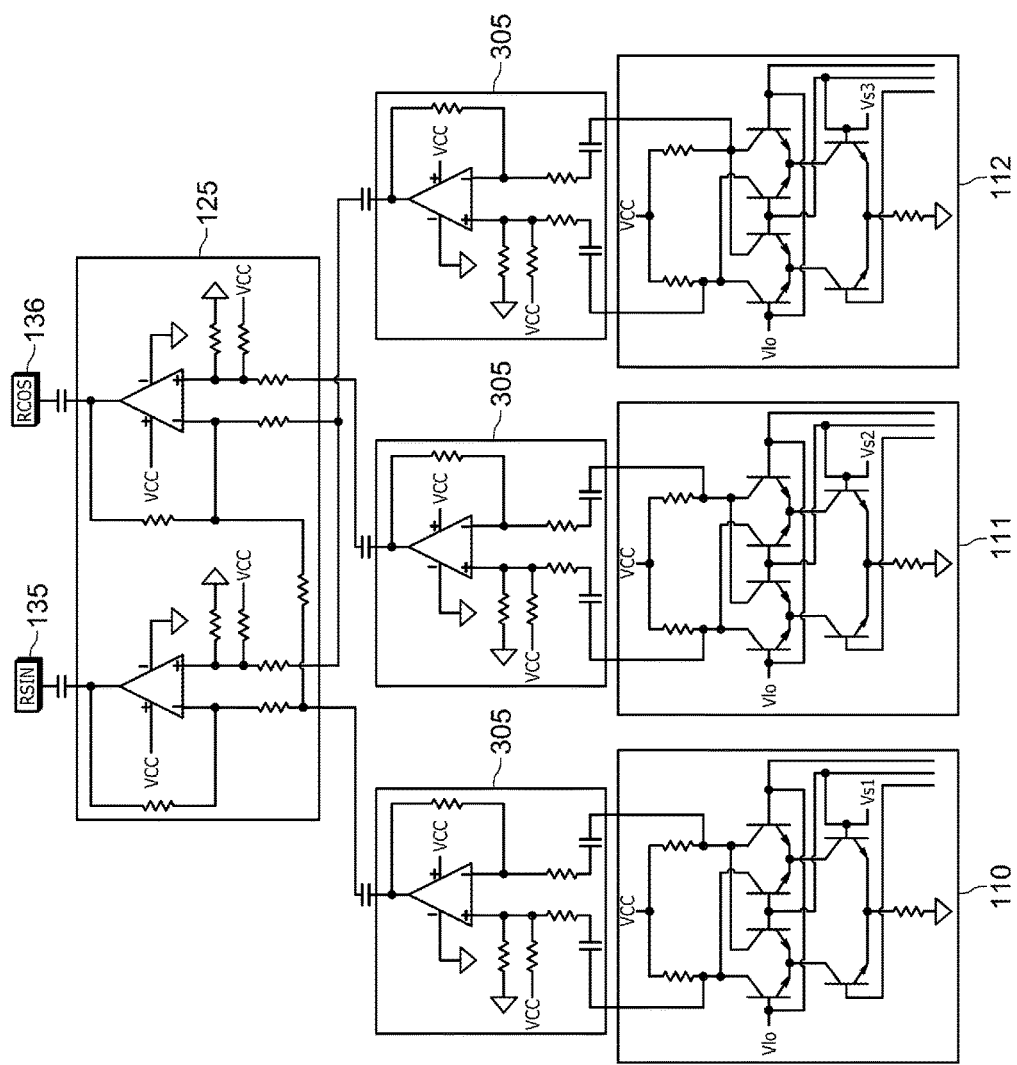
FIG. 6 illustrates a full circuit schematic of an analog synchro to resolver converter according to one embodiment.

A circuit schematic of the converter 100 is illustrated in FIG. 6. Each of the Gilbert Cells 110-112 receives one phase of a carrier waveform from the sensor 105. The Gilbert Cells 110-112 down convert the carrier waveform and send an output to the portions 305 of the low-pass filter 120 to filter out a high frequency signal. The low-pass filter 120 then outputs three converted signals (one for each phase) to the Scott transformer 125, where the three-phase signal is converted into a two-phase signal with the sine component 135 and the cosine component 136.

Figure 7:
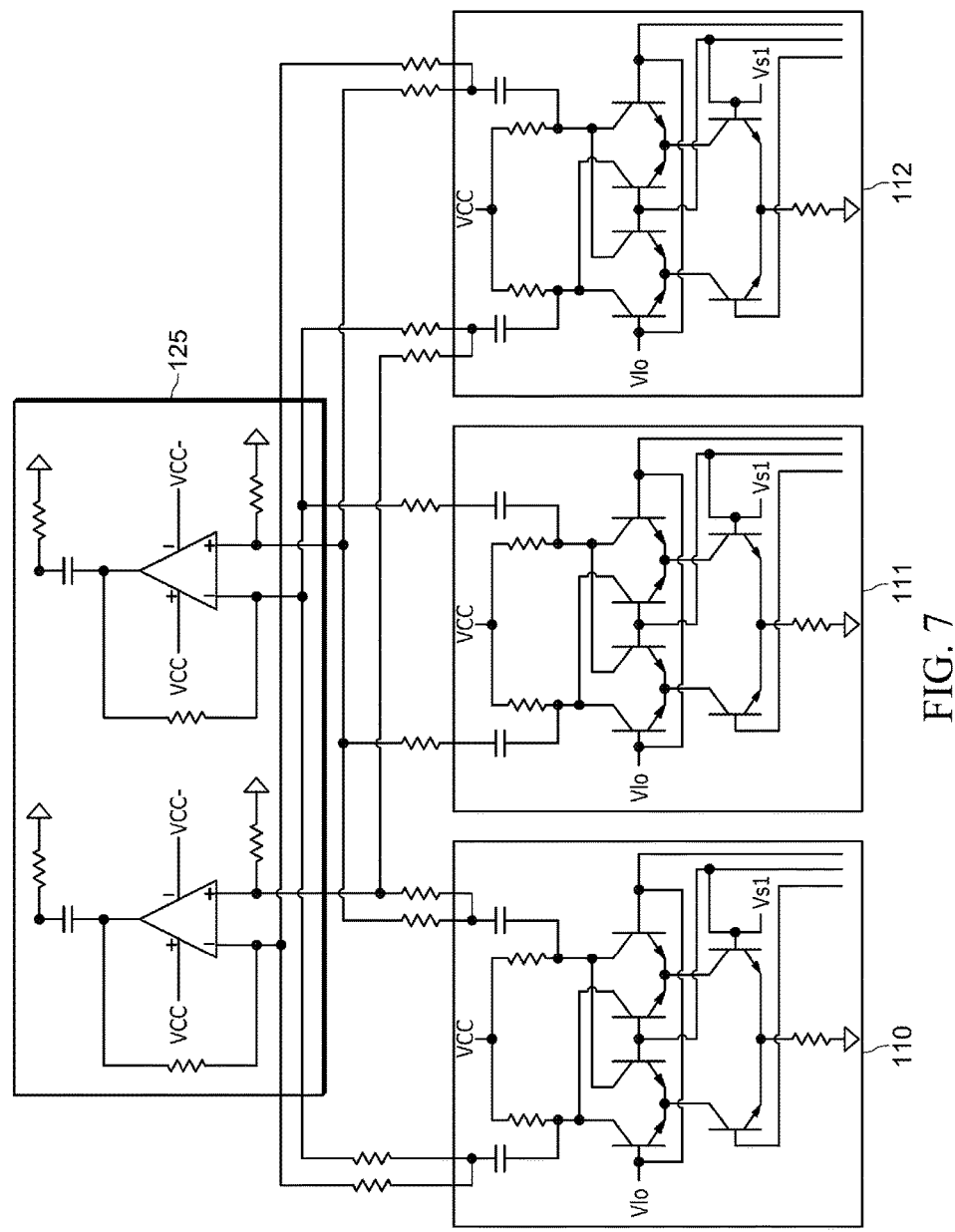
FIG. 7 illustrates a full circuit schematic of an analog synchro to resolver converter without a low-pass filter according to one embodiment.

In some embodiments, the low-pass filter 120 is not required if the Gilbert Cell outputs 215a-b are sent directly to the Scott transformer 125. This embodiment of the converter 100 is illustrated in FIG. 7. Instead of the low-pass filter 120, the Gilbert Cell outputs 215a-b are sent through a suitably specified resistor network 710. The sine and cosine output of the Scott transformer 125 is then connected to an electronic controller.

Thus, embodiments described herein provide, among other things, an analog converter for a motor angle sensor. Various features, advantages, and embodiments are set forth in the following claims.

What is claimed is:

1. An analog converter for a motor angle sensor, comprising:
   at least two Gilbert Cells configured to receive a signal from a motor angle sensor,
   an intermediate frequency signal source configured to provide an intermediate frequency signal to the at least two Gilbert Cells, and
   a low-pass filter configured to receive an output from the at least two Gilbert Cells and output a converted signal to an electronic controller.

2. The converter of claim 1, wherein the received signal includes three phases and the converted signal includes two phases.

3. The converter of claim 2, further comprising a Scott transformer.

4. The converter of claim 3, wherein the Scott transformer converts the output from the at least two Gilbert Cells to the converted signal.

5. The converter of claim 1, wherein the converter includes only two Gilbert Cells.

6. The converter of claim 1, wherein the converter includes three Gilbert Cells.

7. The converter of claim 1, wherein the at least two Gilbert Cells mix the intermediate frequency signal and the received signal to create the output from the at least two Gilbert Cells.

8. The converter of claim 1, wherein the motor angle sensor detects an absolute position and rotational speed of a rotor of an electric motor.

9. The converter of claim 1, wherein an analog-to-digital converter converts the output from the at least two Gilbert Cells to the converted signal and the converted signal is a sine/cosine signal.

10. The converter of claim 9, wherein the converted signal is a digital signal, and a digital to analog converter is used to convert the converted signal to a signal usable by the electronic controller.

11. The converter of claim 1, further comprising a plurality of low-pass filters.

12. The converter of claim 11, wherein a number of the plurality of low-pass filters is equal to a number of Gilbert Cells.

13. The converter of claim 1, wherein the excitation signal has a frequency equal to the difference between a frequency of the received signal from the motor angle sensor and a desired frequency of the output of the at least two Gilbert Cells.

14. The converter of claim 1, wherein the motor angle sensor has a number of channels equal to a number of Gilbert Cells.

15. The converter of claim 1, wherein the output of the at least two Gilbert Cells contains two main frequencies, the two main frequencies being above and below an original frequency of the received signal from the motor angle sensor.

16. The converter of claim 15, wherein the low-pass filter filters out frequencies above the original frequency.

* * * * *